(12) United States Patent
Enjalbert

(10) Patent No.: US 9,552,893 B2
(45) Date of Patent: Jan. 24, 2017

(54) SAMPLE-AND-HOLD CIRCUIT AND CAPACITIVE SENSING DEVICE THAT INCLUDES THE SAMPLE-AND-HOLD CIRCUIT

(75) Inventor: Jerome Enjalbert, Fonsorbes (FR)

(73) Assignee: NXP USA, Inc., Austin, TX (US)

( * ) Notice: Subject to any disclaimer, the term of this patent is extended or adjusted under 35 U.S.C. 154(b) by 20 days.

(21) Appl. No.: 14/420,364

(22) PCT Filed: Aug. 8, 2012

(86) PCT No.: PCT/IB2012/001818
§ 371 (c)(1),
(2), (4) Date: Feb. 8, 2015

(87) PCT Pub. No.: WO2014/023994
PCT Pub. Date: Feb. 13, 2014

(65) Prior Publication Data
US 2015/0206598 A1    Jul. 23, 2015

(51) Int. Cl.
*G11C 27/02*    (2006.01)
*G01R 27/26*    (2006.01)

(52) U.S. Cl.
CPC ............ *G11C 27/024* (2013.01); *G01R 27/26* (2013.01)

(58) Field of Classification Search
CPC .............................. G11C 27/024; G01R 27/26
USPC ........................................................ 324/658
See application file for complete search history.

(56) References Cited

U.S. PATENT DOCUMENTS

| | | | | |
|---|---|---|---|---|
| 4,361,769 A | * | 11/1982 | Hatchett | G11C 27/024 327/379 |
| 6,642,752 B1 | * | 11/2003 | Nagaraj | G11C 27/026 327/94 |
| 7,397,287 B2 | | 7/2008 | Makihara | |
| 7,583,088 B2 | | 9/2009 | Mijuskovic et al. | |
| 7,746,254 B2 | | 6/2010 | Makihara et al. | |
| 2006/0164279 A1 | | 7/2006 | Brewer et al. | |
| 2011/0279148 A1 | | 11/2011 | Watanabe | |
| 2012/0162000 A1 | | 6/2012 | Gotoh | |
| 2012/0313668 A1 | * | 12/2012 | Moldsvor | G11C 27/024 327/94 |
| 2013/0162269 A1 | * | 6/2013 | Julicher | G01R 19/25 324/658 |
| 2013/0222335 A1 | * | 8/2013 | Lee | G11C 27/024 345/174 |

OTHER PUBLICATIONS

International Search Report and Written Opinion correlating to PCT/IB2012/001818 dated Mar. 21, 2013.

* cited by examiner

*Primary Examiner* — Billy Lactaoen
(74) *Attorney, Agent, or Firm* — Charlene R. Jacobsen

(57) ABSTRACT

A sample-and-hold circuit is provided. The sample-and-hold circuit includes an input one or more dedicated capacitive elements, one or more parasitic capacitive elements connected to said one or more dedicated capacitive elements, an output, a group of switches, and a control unit. The control unit controls said switches so as to interconnect said input, said one or more dedicated capacitive elements, and said output in a cyclic manner in accordance with a sample-and-hold cycle.

13 Claims, 10 Drawing Sheets

Fig. 3

| Mode | Normal (00) | | Low Noise Low Power (01) | | High Resolution (10) | | Low Power (11) | |
|---|---|---|---|---|---|---|---|---|
| ODR | Current µA | OS Ratio | Current µA | OS Ratio | Current µA | OS Ratio | Current µA | OS Ratio |
| 1.56 Hz | 24 | 128 | 8 | 32 | 165 | 1024 | 6 | 16 |
| 6.25 Hz | 24 | 32 | 8 | 8 | 165 | 256 | 6 | 4 |
| 12.5 Hz | 24 | 16 | 8 | 4 | 165 | 128 | 6 | 2 |
| 50 Hz | 24 | 4 | 24 | 4 | 165 | 32 | 14 | 2 |
| 100 Hz | 44 | 4 | 44 | 4 | 165 | 16 | 24 | 2 |
| 200 Hz | 85 | 4 | 85 | 4 | 165 | 8 | 44 | 2 |
| 400 Hz | 165 | 4 | 165 | 4 | 165 | 4 | 85 | 2 |
| 800 Hz | 165 | 2 | 165 | 2 | 165 | 2 | 165 | 2 |

SAMPLE-AND-HOLD CIRCUIT AND CAPACITIVE SENSING DEVICE THAT INCLUDES THE SAMPLE-AND-HOLD CIRCUIT

FIELD OF THE INVENTION

This invention relates to a sample-and-hold circuit, a capacitive sensing device, and a method of operating a sample-and-hold circuit.

BACKGROUND OF THE INVENTION

A sample-and-hold circuit is an electronic circuit for sensing the level of a physical quantity during a short first time interval (sampling phase or observation phase) and maintaining a state indicative of the measured signal during a second time interval (hold phase) which may be longer than the first time interval. The physical quantity may, for instance, be a voltage or an electrical current. The first time interval may, in principle, be arbitrarily short, whereas the second time interval may be arbitrarily long. The level measured during the first interval may, in many cases, be considered the instantaneous level of the physical quantity in question. The measured level may also be referred to as a sample.

The state which represents the measured level may, for instance, be the electrical charge of a capacitor or a digital state. The second time interval, i.e., the period during which the sample-and-hold circuit indicates the measured level, can be used to read out the sample-and-hold circuit, i.e., transfer information representing the measured level to another device or control another device in dependence on the measured level. The second time interval can notably be used to digitize the measured level, i.e., generate a digital representation of the measured level. To this end, an analog to digital converter (ADC) may be connected to an output of the sample-and-hold circuit.

The sample-and-hold circuit may be arranged to sample the received input signals repeatedly at many instances, for instance, at a constant or variable sampling rate. The sample-and-hold circuit may thus generate a discreet set of sample values based on the received continuous or discontinuous input signal.

A sample-and-hold circuit may notably be integrated in various types of sensing devices. A sensing device may, for instance, include a capacitive, inductive, or resistive sensor element arranged to generate alone or in conjunction with other electronic components a sensor signal that may be fed to the sample-and-hold circuit.

SUMMARY OF THE INVENTION

The present invention provides a sample-and-hold circuit, a capacitive sensing device, and a method of operating sample-and-hold circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 3 shows a table illustrating different operating modes of the circuit shown in FIG. 1.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
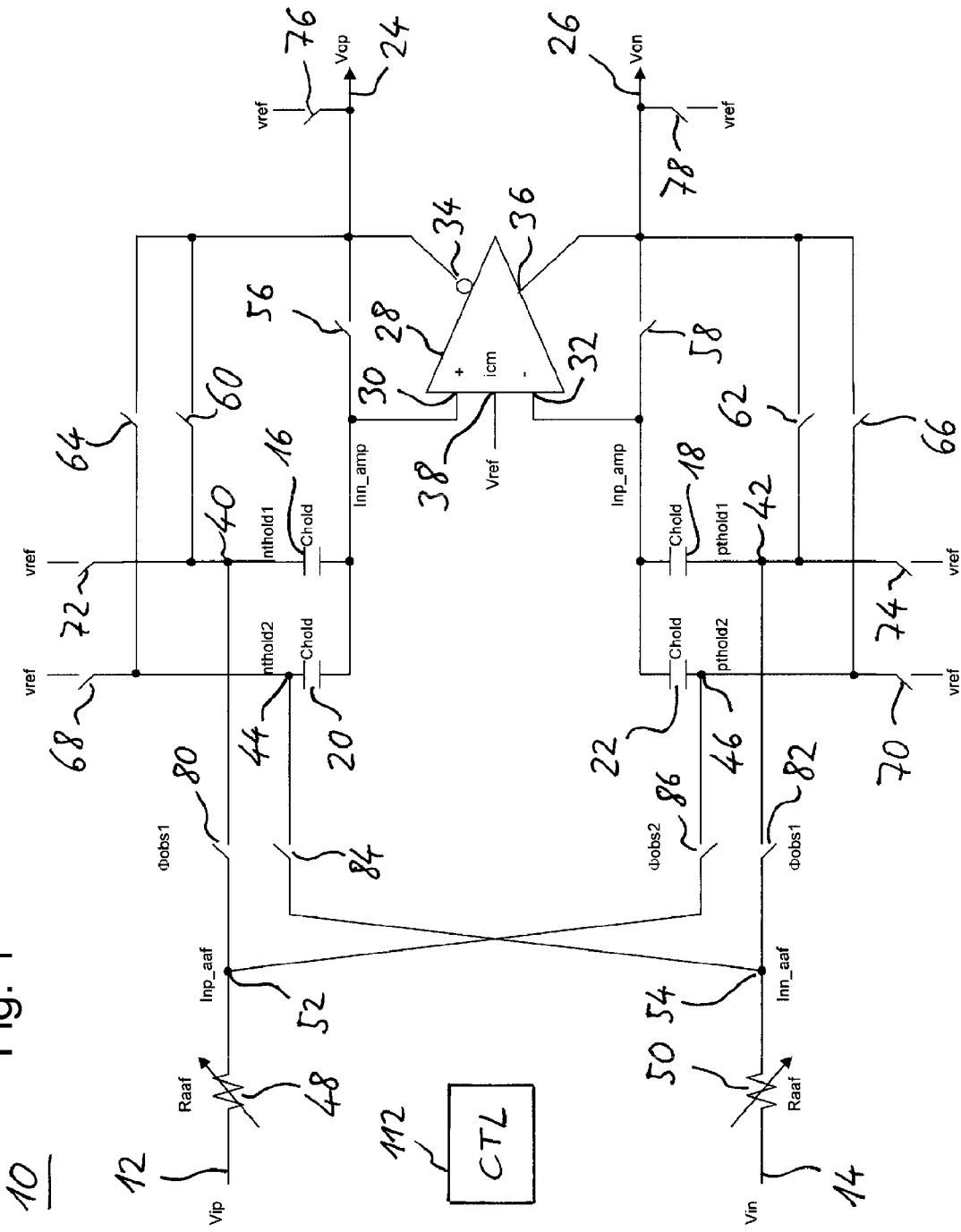
FIG. 1 schematically shows a circuit diagram of an example of an embodiment of a sample-and-hold circuit.

FIG. 1 illustrates an example of a sample-and-hold (SH) circuit 10. The SH circuit 10 may notably comprise an input 12, 14, one or more dedicated capacitive elements 16, 20, an output 24, 26, several switches 56, 58, 60, 62, 64, 66, 68, 70, 72, 74, 76, 78, 80, and 84. The circuit 10 may further comprise a control unit 112. In this example, the control unit 112 may be connected to each of the switches 56 to 86 via a plurality of control lines (not shown). The SH circuit 10 may notably be implemented as an integrated circuit or form part of an integrated circuit. Each dedicated capacitive element may, for instance, comprise one or more capacitors.

The SH circuit 10 may be operated to sense an input voltage applied at the input 12, 14 during a relatively short observation period using the dedicative capacitive elements 16, 18, 20, and 22 and provide an output voltage at output 24, 26 that may be indicative of the sensed input voltage during a subsequent hold period. The hold period may be significant longer than the observation period.

In the shown example, the SH circuit 10 may be fully differential. Notably, the input 12, 14 may be a differential input comprising a first input terminal 12 and a second input terminal 14. The input voltage may thus be defined, for example, as the voltage at the first input terminal 12 minus the voltage at the second input terminal 14 or vice versa. The output 24, 26 may similarly be a differential output comprising a first output terminal 24 and a second output terminal 26. The output voltage may thus be defined, for example, as the voltage at the first output terminal 24 minus the voltage at the second output terminal 26 or vice versa. Alternatively, the SH circuit 10 may be of a non-differential design.

The sample-and-hold circuit 10 may notably be operated in a cyclic manner, e.g., periodically at a certain sampling frequency. The sampling frequency may be fixed or tunable. Each cycle (SH cycle) may notably comprise an observation phase for sampling the input voltage and a subsequent read-out phase for providing an output voltage that may be indicative of the sampled input voltage. The output voltage may notably be identical or proportional to the sampled input voltage. The sampled input voltage may be defined as a level of the input voltage during the observation phase, e.g., as an average level during the observation phase. The cycle may also be referred to as sample-and-hold (SH) cycle.

Each SH cycle may further comprise a sleep phase subsequent to the read-out phase. During the sleep phase, the SH circuit 10 or portions thereof may be in a low power mode. For instance, the SH circuit or portions or components thereof may be switched off during the sleep phase. In the shown example, the various phases of the sample-and-hold cycle may be implemented by controlling the switches 56 to 86 in an appropriate manner. In the present example, the control unit 112 may be arranged to control these switches so as to interconnect the input 12, 14, the dedicated capacitive elements 16, 18, 20, 22, and the output 24, 26 in a cyclic (i.e., repetitive) manner to implement the desired sample-and-hold cycle.

The SH circuit 10 may further comprise an operational amplifier 28. In this example, the operational amplifier 28 may, for instance, comprise an input 30, 32, an output 34, 36, and a reference level input 38. The input 30, 32 may comprise a first input terminal 30 and a second input terminal 32. The output 34, 36 may similarly comprise a first output terminal 34 and a second output terminal 36. The output voltage levels V34 and V36 may be related to the input voltage levels V30, V32, and V38 (at nodes 34, 36, 30, 32, and 38, respectively), as follows: V34=V38+G*(V30−V38) and V36=V38+G*(V32−V38). G is the gain of the operational amplifier 28. V38 may be a reference voltage and may also be denoted Vref. The input level difference V32−V30 may thus be amplified as follows: V36−V34=G*(V32−V30).

The SH circuit 10 may further comprise one or more resistive elements 48, 50 to provide a low pass filter for the input voltage. High frequency noise in the signal to be sampled may thus be reduced. The resistive elements 48, 50 may each comprise one or more resistors.

Figure 2:
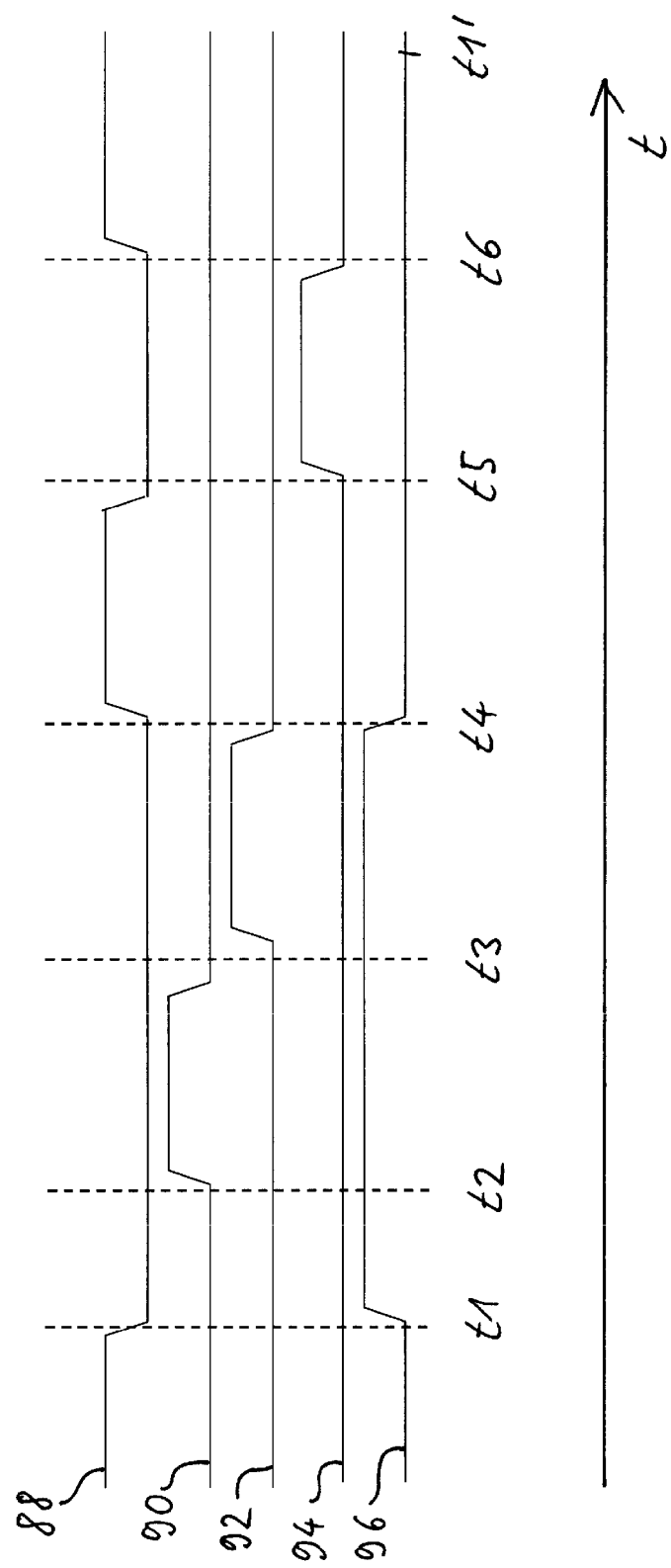
FIG. 2 schematically shows a timing diagram of switch control signals, as function of time, during a hold and sample cycle of the circuit shown in FIG. 1.

An example of a sample-and-hold cycle is further described by making additional reference to FIG. 2. FIG. 2 illustrates control signals 88, 90, 92, 94, and 96 for controlling the mentioned switches in the SH circuit 10. The control signals may, for example, be generated by the control unit 112. Each signal may, for instance, be a voltage level which is a function of time t as illustrated, by way of example, in FIG. 2. In the shown example, the SH cycle may be the time interval t1, t1', i.e., the considered cycle may start at time t1 and end at time t1'. At time t1', the cycle may be repeated. In other words, t1' may mark the beginning of the next cycle. t1' may insofar be identical with t1. In this specification, a prime (') may indicate a time of a next cycle. In practice, the cycle may be performed more than, e.g., 100 times per second.

In the present example, control signal 88 may be used to turn on and off the group of switches 68, 70, 72, 74, 76, and 78 (sleep phase switches). In the example, these switches are each connected to a reference voltage source which may provide said reference voltage Vref. By turning on these switches, i.e., by setting them into their conductive states, the reference voltage Vref may be applied at nodes 40, 42, 44, 46, 24, 26 when desired, e.g., during sleep or idle phases of the SH circuit 10. Turning on these switches may allow to prevent or reduce charge loss from the capacitive elements 16, 18, 20, 22 during such idle or sleep phases, e.g., when switches 56, 58, 60, 62 are turned off.

Control signal 90 may be fed to the group of switches 80 and 82 to connect the input 12, 14 to the dedicated capacitive elements 16 and 18, respectively, e.g., via the resistive elements 48 and 50.

Control signal 92 may be fed to the group of switches 84 and 86 to connect the input 12, 14 to the dedicated capacitive elements 20 and 22, respectively, via the resistive elements 48 and 50.

Control signal 94 may be fed to the group of switches 60, 62, 64, 66 (read-out switches).

Control signal 96 may be fed to the group of switches 56 and 58 (unity gain switches).

In the example shown, the sample-and-hold cycle t1-t1' may comprise a first observation phase t2-t3, a second observation phase t3-t4, a first sleep phase t4-t5, a read-out phase t5-t6, and a second sleep phase t6-t1' (not shown), wherein t1' corresponds to the beginning of the next cycle. The first observation phase t2-t3 and the second observation phase t3-t4 may be referred to together as the observation phase.

In the first observation phase t2-t3, the switches 80, 82 (first observation switches), and the unity gain switches 52, 58 may be closed (on). The other switches may be open (off). The nodes 30 and 32 may thus have the reference voltage Vref applied at the input 38 (reference voltage input). The holding nodes 40 and 42 may settle at voltage levels Vip and Vin applied at the first input terminal 12 and the second input terminal 14, respectively. The voltage across the capacitive element 16, i.e., the voltage between the nodes 30 and 40, may thus settle at Vip-Vref, while the voltage across the capacitive element 18, i.e., the voltage between nodes 32 and 42, may settle at Vin-Vref. The first observation phase t2-t3 may thus produce an electrical charge at the capacitive element 16 and at the capacitive element 18, respectively. The charge accumulated at the capacitive element 16 and at the capacitive element 18 may be proportional to the input voltage level Vip and Vin, respectively.

The time it takes for the voltage levels across the capacitive elements 16 and 18 to settle may notably depend on the resistance of the resistive elements 48 and 50. The settle times may be longer for larger values of the resistance and shorter for smaller values of the resistance of the resistive elements 48 and 50, respectively. A maximum possible sampling frequency of the SH circuit 10 may thus depend on the selected resistance values of the resistive elements 48 and 50. Higher sampling frequencies may be possible with lower values of the resistance. On the other hand, suppression of high frequency noise in the input voltage at the input 12, 14 may be more effective with higher resistance values. The actual choice of the resistance of the resistive elements 48 and 50 may thus be a compromise between sampling speed and suppression of high frequency noise.

The second observation phase t3-t4 may be identical in principle to the first observation phase t2-t3. The second observation phase t3-t4 may be included in the SH cycle t1-t1' to improve the accuracy or reliability of the sampled values. To this end, an inverted input voltage may be applied at the input 12, 14 during the second observation phase t3-t4.

The means for generating the inverted input voltage may be external to the SH circuit 10 and are not shown in the figures. An example application in which it may be beneficial to make use of a second observation phase involving an inverted input voltage is sampling the voltage across a capacitive sensor. The capacitive sensor may, for instance, be part of an accelerometer.

The capacitive sensor may be coupled to the SH circuit 10 directly or indirectly. For instance, there may be a capacitance-to-voltage stage coupled between the capacitive sensor and the SH circuit 10. The capacitance-to-voltage stage may be arranged to turn capacitance variation in the sensor into an electrical signal, e.g. a voltage. The capacitive sensor may, for instance, be a Microelectromechanical systems (MEMS) sensor. The sensor may need to be excited with a pair of excitation signals switching during the $1^{st}$ observation from a rest voltage (e.g. Vref) to e.g. 2*Vref for the $1^{st}$ excitation signal and e.g. 0 volt (V) for the $2^{nd}$ excitation signal. The voltage change may therefore be, for example, +Vref for the $1^{st}$ excitation signal and −Vref for the $2^{nd}$ excitation signal. During the $2^{nd}$ observation period, the $1^{st}$ excitation signal may be switched to 0 V and the $2^{nd}$ excitation signal may be switched to 2*Vref, for example. Therefore, the voltage change with respect to the rest state (both excitation signals at e.g. Vref) may be −Vref for the $1^{st}$ excitation signal and +Vref for the $2^{nd}$ excitation signal, for example. This may generate signals of opposite polarity at the input of the SH circuit in the two observation phases.

In the second observation phase, the switches 84 and 86 (second observation switches) as well as the unity gain switches 56 and 58 may be closed while all other switches shown in FIG. 1 may be open (off). The capacitive elements 20 and 22 may thus be charged and settle at voltage levels corresponding to the voltage levels applied at the first input terminal 12 and the second input terminal 14, respectively. In the shown example, they may be charged via the resistive elements 48 and 50, respectively.

For instance, assuming that the input levels Vip and Vin are V1 and V2 during the first observation phase, Vip and Vin may be V2 and V1 during the second observation phase, respectively. In this case, the voltage levels across the capacitive elements 16 and 20 may be the same, namely, V1-Vref, and the voltage levels across the capacitive elements 18 and 22 may the same, namely, V2-Vref. In practice, the nodes 40 and 44 may settle at levels which are not the same. Similarly, the nodes 42 and 46 may settle at voltage levels which are not the same. Such voltage difference between the nodes 40 and 44 and between the nodes 42 and 46 may, for example, be due to fluctuations in the input voltage received at the input 12, 14 or to imperfections of the SH circuit 10. A particularly reliable estimate of the input voltage may be found by taking an average over the voltage levels at nodes 40 and 44 and furthermore by taking another average over the voltage at nodes 42 and 46. In the present example, such averaging may be done, for instance, in the sleep phase t4-t5 (see below). Alternatively, it may be done in the read-out phase t5-t6. This may be beneficial, for example, in a design in which there is no sleep phase or other phase between the observation phase t2-t4 and the read-out phase t5-t6, i.e. in a design in which the observation phase t2-t4 is immediately followed by the read-out phase t5-t6.

The sample-and-hold cycle t1-t1' may further comprise a first sleep phase t4-t5. The operational amplifier 28 may be switched off during the first sleep phase t4-t5 to save energy. The first sleep phase t4-t5 may, for instance, be used to perform an independent measurement on the same or other physical quantities using another circuit or device. For instance, in the case of a three dimensional accelerometer, the observation phase t2-t4 may be used to sample the voltage from an acceleration sensor for a X-axis, and the first sleep phase t4-t5 may be used to sample voltage levels from acceleration sensors for a Y-axis and a Z-axis using two additional sample-and-hold circuits (not shown) which may be similar or identical to the SH circuit 10 of FIG. 1.

In the first sleep phase t4-t5, the sleep phase switches 68, 70, 72, 74, 76, and 78 may be closed while all other switches shown in FIG. 1 may be open. The reference voltage Vref may thus be applied on a top side of the capacitive elements 16, 18, 20, 22, e.g. at the nodes 40, 42, 44, 46. A bottom side of the capacitive elements 16, 18, 20, 22, e.g. the nodes 30 and 32, may be floating during the sleep phase t4-t5. The charge of the capacitive elements 16, 18, 20, 22 may thus be redistributed between these capacitive elements. 2The voltage levels across the capacitive elements 16 and 20, which may have been established in the preceding first and second observation phase t2-t3 and t3-t4, respectively, may thus be averaged. Similarly, the voltage levels across the capacitive elements 18 and 22, which may have been established during the first and second observation phase t2-t3 and t3-t4, respectively, may be averaged. The resulting voltage at the nodes 30 and 32 may depend on the voltage that was stored on the capacitive elements 16, 18, 20, 22 during the observation phases t2-t3 and t3-t4. For example, if (V1−Vref) was stored across the capacitive elements 16 and 20, then the voltage at the node 30 during the sleep phase t4-t5 may be (2*Vref−V1). The voltage across the capacitive elements 16 and 20, equal to (V1−Vref) in this example, may be conserved. Holding one side of the capacitive elements at Vref during the sleep phase allows to know the maximum and minimum voltages at the other side, e.g. based on a maximum signal swing. and to make sure that these maximum and minimum voltages are in a range in which they are not likely to generate a significant leakage current through the opened switches 56 and 58. As such leakage currents may entail a loss of charge at the capacitive elements 16, 18, 20, 22 and connected nodes, they may be susceptible to introducing an error to the output voltage that may be difficult to correct.

In fact, any charge loss after the read-out phase t5-t6 and before the next observation phase t2'-t3' may increase the charging time for the capacitive elements 16, 18, 20, 22 in the next cycle.

The first sleep phase may be followed by the read-out phase t5-t6. In the read-out phase t5-t6, the read-out switches 60, 62, 64, 66 may be closed (on) while all other switches shown in FIG. 1 may be open (off). Furthermore, the operational amplifier 28 may be switched on. Closing the read-out switches 60, 62, 64, 66 may drive the output voltage at the output terminals 24 and 26 to a level equal to the reference voltage Vref plus the voltage across the capacitive elements 16 and 20 and 18 and 22, respectively.

It is noted that closing the read-out switches 60, 62, 64, 66 may cause the capacitive elements 16 and 20 and, similarly, the capacitive elements 18 and 22 to be connected parallel, respectively. This may result in charge balancing between the capacitive elements 16 and 20 and similarly between the capacitive elements 18 and 22. As mentioned above, the charge accumulated during the first observation phase t2-t3 at capacitive element 16 and the charge accumulated at capacitor 20 during the second observation phase t3-t4 may thus be averaged. In the shown example, however, this charge balancing and thus voltage averaging may already take place in the sleep phase t4-t5 preceding the read-out phase t5-t6. Similarly, the charges accumulated at capacitive elements 18 and 22 may thus be averaged. It may be beneficial that the capacitive element 20 has the same capacitance as capacitive element 16. It may be similarly beneficial that capacitive element 22 has the same capacitance as capacitive element 18. The first observation phase t2-t3 and the second observation phase t3-t4 may thus have the same statistical weight. The output voltage at the output 24, 26 may be fed to another device (not shown). For instance, it may be fed to an analog to digital converter (ADC) (see also FIG. 10).

The sample-and-hold circuit 10 may have different operating modes. An operating mode may, for example, be characterized by the values of one or more operating parameters. The operating parameters may, for instance, include the sampling rate that may be an inverse of the duration of the sample-and-hold cycle. Different operating modes may further differ in the resistance value of the resistive elements 48 and 50. For instance, the SH circuit 10 may have one or more normal power modes and one or more low power modes. A low power mode may be distinguished from a normal power mode by having a lower sampling frequency. The sampling frequency introduced above, e.g., the inverse of the duration of one sample-and-hold cycle, may also be referred to as the output data rate (ODR) as it may need to be distinguished from an internal sampling frequency of the device, e.g., the integrated circuit, in which the SH circuit 10 may be integrated. The integrated circuit may notably be an application specific integrated circuit (ASIC). The internal sampling frequency of the ASIC may be higher than the output data rate of the SH circuit 10. This may allow the output voltage provided at the output 24, 26 to be sampled more than once during the read-out phase t5-t6 (see FIGS. 1 and 2). For instance, in a scenario in which the output 24, 26 is connected to an ADC, digital values corresponding to the differential output voltage Vop-Von at output 24, 26 may be generated at several instances during the read-out phase t5-t6. This may be useful in order to verify that the output voltage of the SH circuit 10 is substantially constant during the read-out phase as expected.

The internal sampling frequency of, e.g., the ASIC may change in relation to the selected ODR. Similarly, the resistance value of the resistive elements 48 and 50 may be adjusted automatically in relation to the selected ODR, e.g., by means of the control unit 112. A cut off frequency of the SH circuit may thus adjust automatically to optimize the power/noise trade off. For instance, the resistive elements 48 and 50 may be arranged such that their individual resistance may be varied between 1 megaohm and two megaohms. The ratio of the internal sampling frequency to the output data rate (i.e., the internal sampling frequency divided by the output data rate) may also be referred to as the oversampling (OS) ratio.

The table in FIG. 3 shows possible values of selected operating parameters of an example of an embodiment of a sampling device comprising an SH circuit 10 as described above in reference to FIGS. 1 and 2. In this example, the sampling device may have a normal mode, a low noise/low power mode, a high resolution mode, and a low power mode. In each of these modes, the SH circuit 10 may be operable at an output data rate (ODR) in a range of 1.56 Hz to 800 Hz, for example. For each mode and for each indicated value of the ODR, the value of a current in microamperes ("Current μA") and an oversampling ratio ("OS Ratio") are indicated. The current values indicate a total current consumption of an example of a capacitive sensing device 2 (cf. FIG. 10) in which the SH circuit 10 is integrated. The OS ratio is the internal sampling frequency of the sampling device divided by the ODR.

For example, at an ODR of 400 Hz, the internal sampling frequency may be 3,200 Hz in normal mode but only 1,600 Hz in low power mode. For each operating mode, the resistance value of the resistive elements 48 and 50 may be chosen sufficiently small to ensure that the voltage across the capacitive elements 16, 18, 20, and 22 may settle during the observation phase. More particularly, the resistance values may be chosen such that the voltage levels across the capacitive elements 16 and 18 may settle during the first observation phase t2-t3 and such that the voltage levels across the capacitive elements 20 and 22 may settle during the second observation phase t3-t4. For instance, the resistance of each of the resistive elements 48 and 50 may be chosen to be two megaohms in normal mode and one megaohm in low power mode. Consequentially, the high frequency noise filtering may be less efficient in low power mode compared to high power mode.

Figure 4:
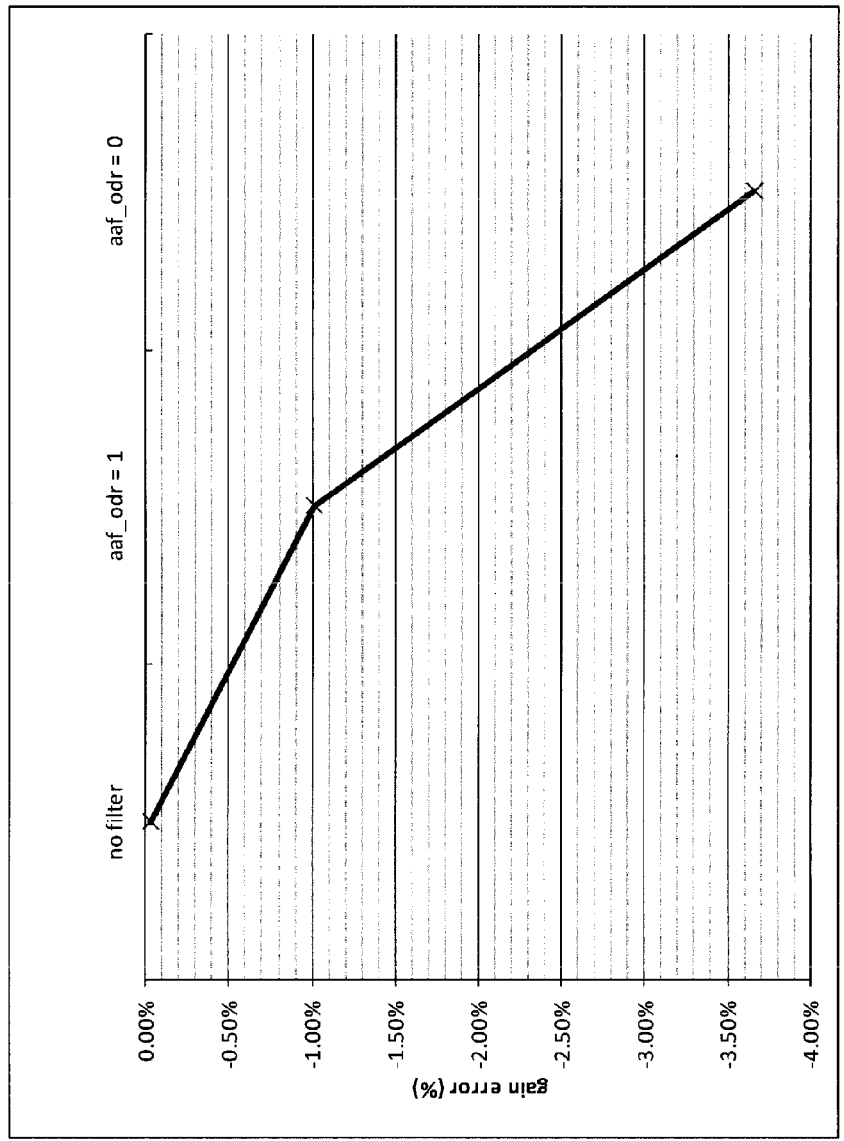
FIG. 4 shows a plot of a gain error observed in a sample-and-hold circuit, such as shown in FIG. 1.

Referring now to FIG. 4, a problem that may be observed with a SH circuit as described above in reference to FIGS. 1, 2, and 3 is addressed. Firstly, it is noted that it may be desirable that the SH circuit 10 has the same gain for each operating mode and each operating data rate. The gain of the SH circuit 10 may be defined as a ratio of the differential voltage Vop-Von output at the nodes 24 and 26 to the differential input voltage applied at the nodes 12 and 14. In the example circuit of FIG. 1, the gain may be expected to be 1 (i.e., unity). In another embodiment, the nominal gain may be different from 1. For instance, the SH circuit 10 may contain in addition to the components shown in the Figure, an amplifier or a voltage divider.

Referring back to FIG. 4, the gain of the SH circuit 10 may be observed to vary from its nominal value when the resistance values of the resistive elements 48 and 50 are non-zero. The relative gain error, i.e., the observed gain minus the nominal gain relative to the nominal gain, is shown for the resistance values R=0 ("no filter"), R=1 megaohm ("AAF_ODR=1"), and R=2 megaohms ("AAF_ODR=0"). The relative error is seen to be nearly 0 for R=0, −1% for R=1 megaohm, and −3.65% for R=2 megaohms. In principle, this error may be corrected using trimming techniques. However, the gain error may depend not only on the resistance value but on other operating parameters as well. Correcting the error by means of additional electrical components may therefore require numerous tests for many different combinations of values of these parameters and become very expensive. Furthermore, even if the gain error is trimmed out in a final factory test, it may reappear as soon as resistance values different from those used during the trim are selected. It was also noted that the resistance values may vary with the temperature of the device.

Figure 5:
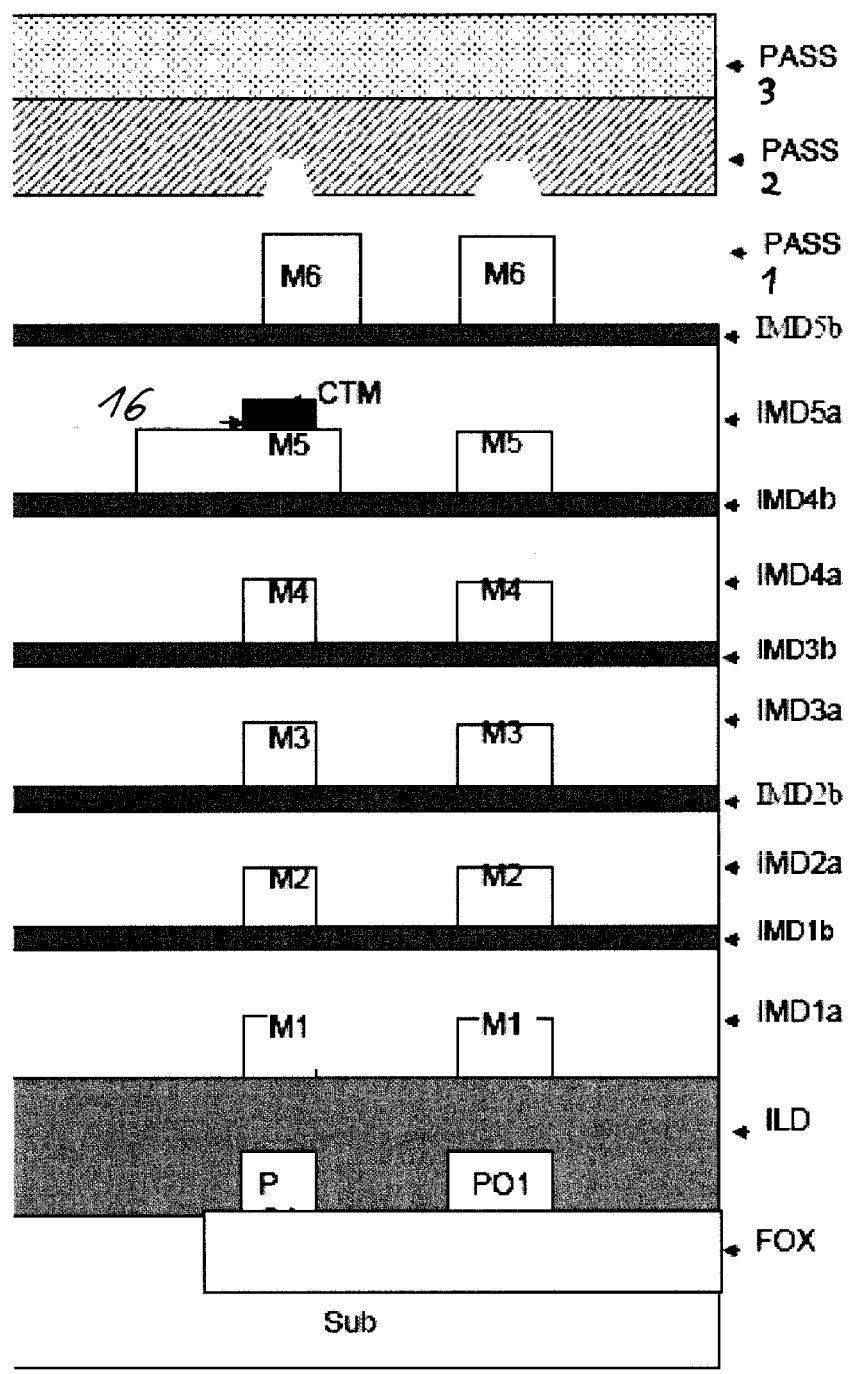
FIG. 5 schematically illustrates a cross-sectional view of an example of an embodiment of an integrated circuit comprising a sample-and-hold circuit as shown in FIG. 1.

Referring now to FIG. 5, it has been found out that the deviation of the gain from its nominal value may be explained at least partly by the presence of design specific parasitic capacitors connected to, e.g., the dedicated capacitive elements 16, 18, 20, 22.

FIG. 5 illustrates an example of an integrated circuit comprising the SH circuit 10 shown in FIG. 1. This integrated circuit may comprise several layers stacked atop each other on a substrate SUB. In this example, the IC may comprise, for instance, the following layers in this order, starting with the lowest layer, i.e., the layer closest to the substrate: FOX, ILD, IMD1a, IMD1b, IMD2a, IMD2b, IMD3a, IMD3b, IMD4a, IMD4b, IMD5a, IMD5b, Pass 1, Pass 2, Pass 3. The stack design may be beneficial for reducing the size of the die. In the shown example, the capacitive elements 16, 18, 20, 22 shown in FIG. 1 may be implemented in the form of metal-insulator-metal (MIM) capacitors. They may be stacked, for instance, over active circuitry. The shown example may be implemented, for instance, using 180 nanometer technology from, e.g., the Taiwan Semiconductor Manufacturing company (TSMC). The active circuitry may, for instance, be arranged in layer IMD2a. Each of the capacitive elements 16, 18, 20, 22 (e.g., capacitive element 16) may, for instance, be provided by a capacitor top metal (CTM) arranged atop a metal bottom plate M5. A dielectrical material may be arranged between the capacitor top metal CTM and the capacitor bottom plate M5.

The IC may further comprise a metal element M4. The metal element M4 may be have a strong connection to ground and act as decoupling shield between the active circuitry and the MIM capacitor. The metal element M4 may thus suppress or reduce noise coupling between lower level large switch signals such as switch gate control signals and upper level sensitive signals such as the voltage at the MIM capacitor charge storage nodes. As a side effect, the metal element M4 may create a significant parasitic capacitance between it (M4) and the MIM bottom plate M5. The dedicated capacitive element 16 may, for instance, have a capacitance of approximately 1 picofarad, and the parasitic capacitance between, e.g., M4 and M5 may, for example, be around 240 femtofarad. The parasitic capacitance may be even larger for products with even larger MIM capacitors.

It should be emphasized that the shown design is only an example and that parasitic capacitive elements connected to the dedicated capacitive elements may occur in different designs.

Figure 6:
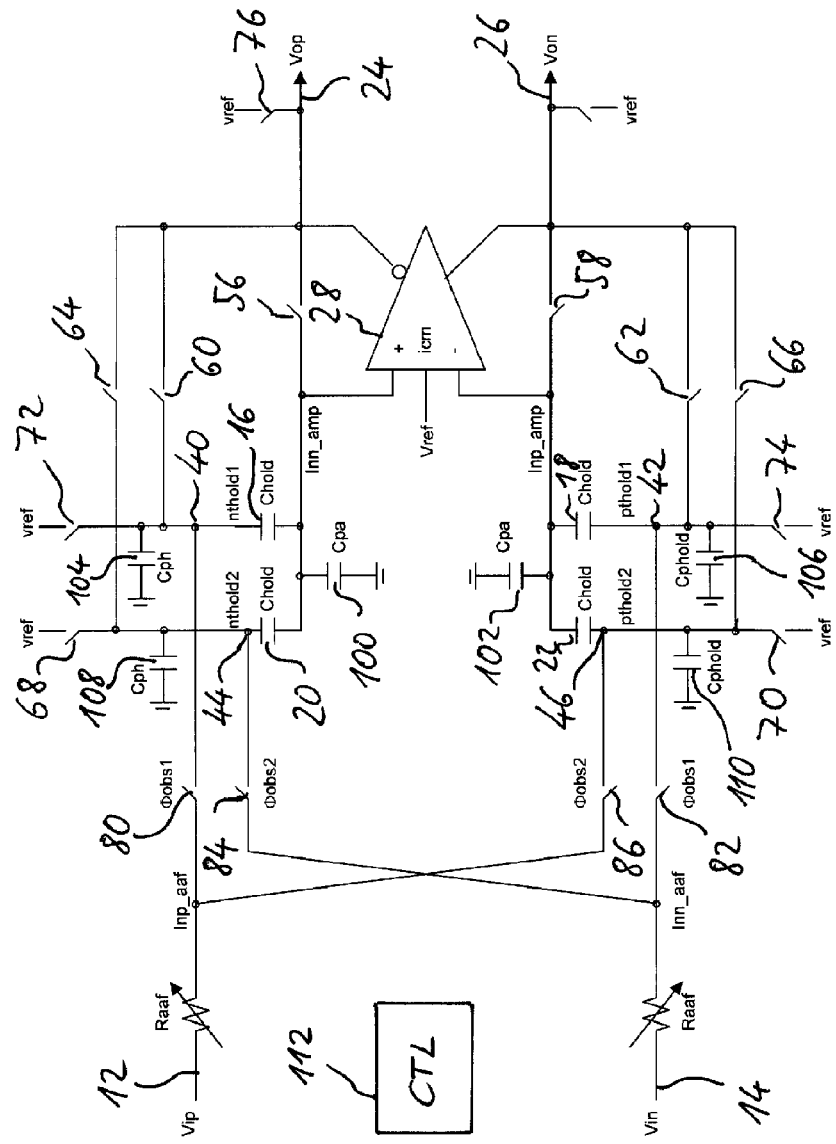
FIG. 6 is a more detailed circuit diagram of the sample-and-hold circuit shown in FIG. 1.

FIG. 6 shows a representation of the SH circuit 10 described above in which parasitic capacitive elements 100, 102, 104, 106, 108, and 110 are taken into account. In the shown example, parasitic capacitive elements 100 and 102 are connected to the output sides of the dedicated capacitive elements 16 and 20, and 18 and 22, respectively. The parasitic capacitive elements 104, 106, 108, and 110 may be connected to the input sides of the dedicated capacitive elements 16, 18, 20 and 22, respectively. It is noted that depending on the design, one or more of these parasitic capacitive elements 100, 102, 104, 106, 108 may be negligible.

A deviation of the gain of the SH circuit 10 and its dependence on the resistance values of the resistive elements 48 and 50 (see FIG. 4) may be explained by the fact that the parasitic capacitive elements may interact with the dedicated capacitive elements 16 to 22. For instance, turning back to FIGS. 1 and 2, it is recalled that at time t6, the operational amplifier 28 may be switched off and the reference voltage Vref may be applied to prevent charge loss from the dedicated capacitive elements 16, 18, 20, 22. Turning the operational amplifier 28 off and closing the sleep phase switches 68, 72, 70, 74, 76, and 78 may cause a forward charge transfer between the dedicated capacitive elements 16, 18, 20, 22 and the parasitic capacitive elements 100 to 110. When the reference voltages switches 68 to 78 are opened and the operation amplifier 28 is again turned on at time t1' (i.e., time t1 of the next cycle), a second charge transfer may occur between the dedicated capacitive elements 16 to 22 and the parasitic capacitive elements 100 to 108. In the example of FIG. 2, the second charge transfer (at time t1') is not necessarily the inverse of the first charge transfer that occurred time t6. This may be explained by the fact that the configuration change at time t1' is in this example not the inverse of the configuration change at time t6. Indeed, in the example of FIG. 2, the read-out switches 60 to 66 are opened at time t6 but not closed at time t1'.

The charges of the dedicated capacitive elements 16 to 22 at the beginning of the next cycle (time t1') may thus differ from the charges accumulated in the preceding observation phase t2-t4. As a result, it may take longer for the dedicated capacitive elements 16 to 22 to be charged in the next observation phase t2'-t4' when compared to an ideal circuit, i.e., a circuit without parasitic capacitance. This may not be a problem if the observation phase t2-t4 is sufficiently long, e.g., if the output data rate is sufficiently low. However, it may introduce an error in the output voltage and thus in the gain if the observation phase t2-t4 is too short for the charging process to be completed. The problem may be more severe for larger resistance values of the resistive elements 48 and 50 as larger resistance values may reduce the electrical current and thus slow down the charging process.

In other words, the SH circuit 10 may be operated at higher data rates if the dedicated capacitive elements 16 to 22 retain their electrical charge from the end of one observation phase (e.g., time t4) to the beginning of the next observation phase (e.g., time t2') so that they are precharged to a value that may be close to the new value if the input voltage levels Vip and Vin vary sufficiently slowly.

Figure 7:
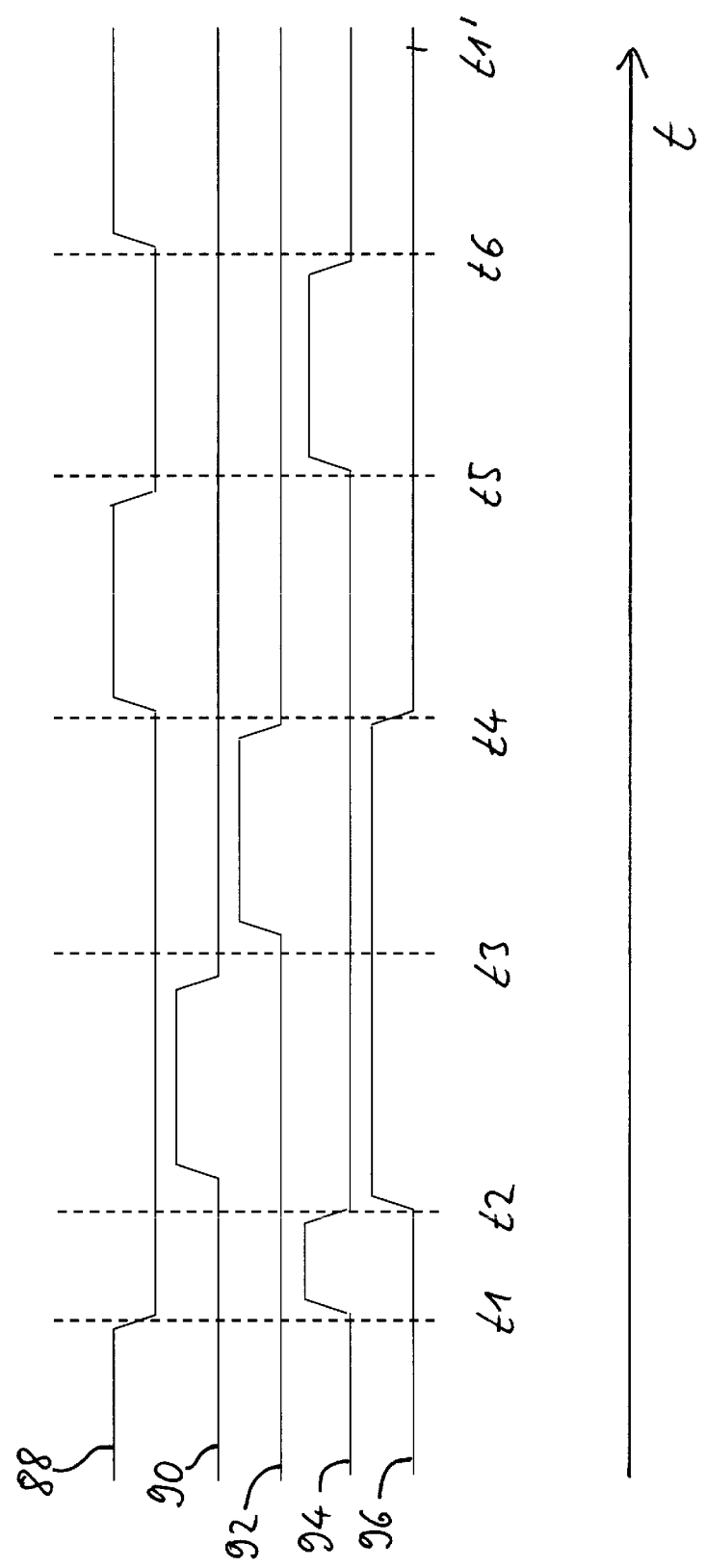
FIG. 7 schematically shows a timing diagram of switch control signals, as functions of time, in accordance with another example of an embodiment.

Referring now to FIG. 7, a modified scheme for operating the switches in the SH circuit 10 shown in FIGS. 1 and 6 is described. The proposed scheme may be identical to the one of FIG. 2 except in that the sample-and-hold cycle t1-t1' in FIG. 1 may comprise a restoration phase t1-t2 between the second sleep phase t6-t1. The control signals 88 to 96 in the restoration phase t1-t2 and in the read-out phase t5-t6 may be identical. In the restoration phase t1-t2, the SH circuit 10 may thus have the same configuration as in the read-out phase t5-t6. As a result, the first charge transfer (forward charge transfer) between the dedicated capacitive elements 16 to 22 and the parasitic capacitive elements 100 to 110, which may have occurred at the beginning of the second sleep phase t6-t1', may be reversed, i.e., canceled by a second charge transfer (reverse charge transfer) during the restoration phase t1-t2. The dedicated capacitive elements (16, 18, 20, 22 in the present example) may thus be recharged to their previous levels, i.e., their levels at the end of the preceding observation phase t2-t4. The required charging time in the next observation phase t2-t4 may thus be reduced. The performance of the SH circuit 10, e.g., the compromise between speed, power consumption, and noise suppression, may thus be improved.

It is noted that this improvement may be achieved by configuring the control unit 112 in a suitable manner. Further modifications of the circuitry may not be necessary. In other words, the control unit 112 may be arranged to control the switches 56 to 82 of the SH circuit 10 so as to interconnect the input 12, 14, the dedicated capacitive elements 16 to 22, and the output 24, 26 in a cyclic manner in accordance with a sample-and-hold cycle that that comprises, in this chronological order:

an observation phase t2-t4 in which said one or more dedicated capacitive elements are disconnected from said output and connected to said input so as to adapt an electrical charge of said capacitive elements to an input voltage Vip, Vin applied at said input, a read-out phase t5-t6 in which said one or more dedicated capacitive elements are disconnected from said input and connected to said output so as to provide an output voltage Vop, Von in dependence on said electrical charge, and a sleep phase t6-t1' in which said one or more dedicated capacitive elements are disconnected from both said input and said output, said sleep phase involving a forward charge transfer between said one or more capacitive elements and said one or more parasitic capacitive elements, and a restoration phase t1-t2 in which said one or more dedicated capacitive elements are disconnected from said input and connected to said output so as to cause a reverse charge transfer between said one or more capacitive elements and said one or more parasitic capacitive elements, said reverse charge transfer canceling said forward charge transfer at least partly.

In other words, charge transfers opposite in sign may be created. These reverse charge transfers may cancel the charge transfers that may have occurred during the previous power down. Gain error may thus be canceled, whatever the parasitic capacitance is.

It may be expected that the proposed restoration phase may be most beneficial for an SH circuit in which the charging currents are reduced due to the presence of a resistive element such as a resistive noise filter, for instance, a low pass filter as described in reference to FIG. 1. However, it is noted that even in the absence of any dedicated resistive element the charging times may be non-zero due to parasitic resistive, capacitive or inductive components.

Figure 8:
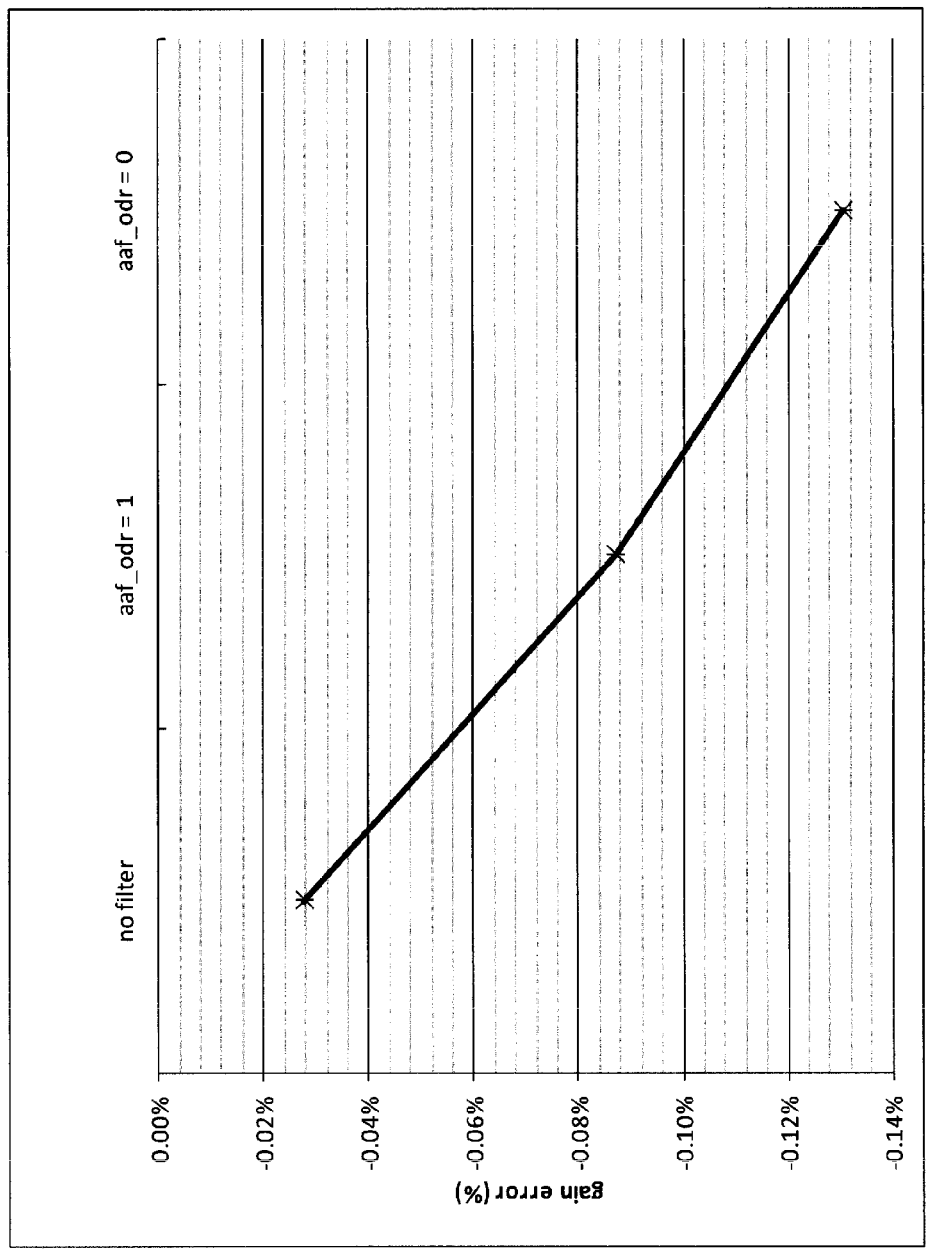
FIG. 8 shows an example of a plot of a gain error observed when operating the sample-and-hold circuit of FIG. 6 using switch control signals as plotted in FIG. 7.

FIG. 8 relates to the same SH circuit 10 as FIG. 4, the only difference being the configuration of the control unit 112. While FIG. 4 illustrates the gain error when the control unit 112 operates in accordance with a cycle as described in reference to FIG. 2, FIG. 8 shows the corresponding gain error that may be observed when the control unit 112 operates in accordance with a cycle described in reference to FIG. 7. The two cycles differ from each in that only the cycle in FIG. 1 comprises a restoration phase t1-t2 in which the circuit is configured as in the preceding read-out phase t5-t6 to generate a reverse charge transfer. According to the plot in FIG. 8, the relative gain error was observed to be about −0.09% for a resistance of 1 megaohm (AAF_ODR=1) and about −0.13% for a resistance of 2 megaohms (AAF_ODR=0). The relative gain error is thus seen to be significantly reduced compared to FIG. 4.

Figure 9:
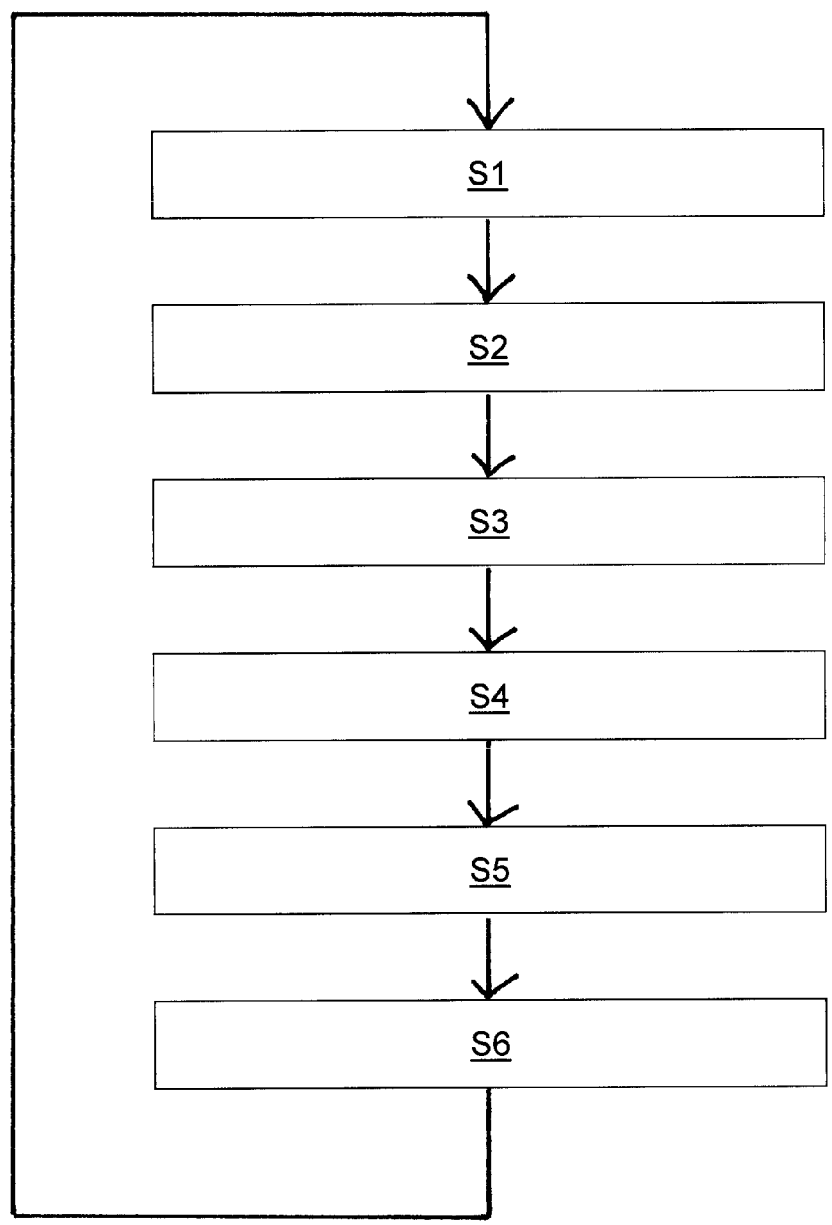
FIG. 9 shows a flow chart of an example of an embodiment of a method of operating a sample-and-hold circuit.

The sample-and-hold circuit described in reference to FIG. 7 is further illustrated by the flowchart in FIG. 9. The blocks S1, S2, S3, S4, S5, and S6 may represent the restoration phase t1-t2, the first observation t2-t3, the second observation phase t3-t4, the first sleep phase t4-t5, the read-out phase t5-t6, and the second sleep phase t6-t1, respectively. The control unit 112 may be arranged to perform the corresponding control actions in the indicated order S1 to S6. At the end of block S6, the process flow may return to block S1.

The restoration phase may be shorter than the read-out phase. For instance, the duration of the read-out phase may be ten times longer than the restoration phase. The read-out phase may thus be sufficiently long to allow for oversampling, i.e., reading out the output voltage more than once during the read-out phase by, e.g., an analog to digital converter. The duration of the restoration phase may, for instance, be around 1 microsecond.

Figure 10:
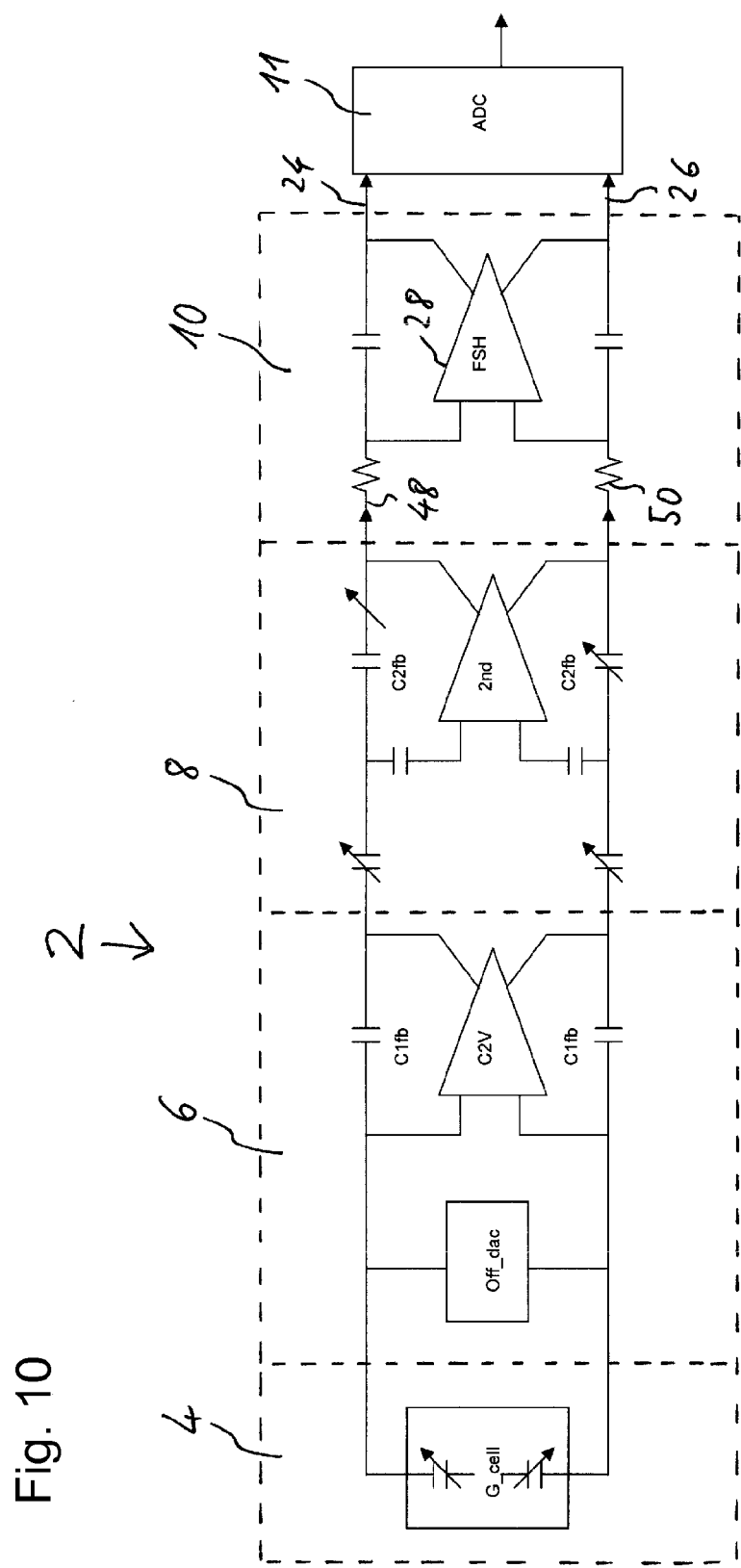
FIG. 10 shows an example of an embodiment of a capacitive sensing device.

FIG. 10 shows an example of a capacitive sensing device 2. The capacitive sensing device 2 may, for instance, be used as an accelerometer, e.g., a three axis consumer accelerometer. The capacitive sensing device 2 may, for instance, comprise a capacitive sensor cell 4 having an output connected to an analog signal chain 6, 8, 10. The analog signal chain 6, 8, 10 may have an output connected to, e.g., an analog to digital converter (ADC) 11. In the shown example, the capacitive sensor 4 may be arranged to generate an output voltage which may, for instance, be amplified and filtered by the analog signal chain 6, 8, 10. In the shown example, the analog chain 6, 8, 10 may comprise, e.g., a first stage 6, a second stage 8, and a third stage 10. The third stage 10 may be the sample-and-hold circuit 10 described above in reference to FIGS. 1 to 9. The first stage 6 may, for instance, comprise an analog filter for filtering out low frequency noise, e.g., noise up to frequencies of about 1 megahertz.

The capacitive sensor cell 4 may, for instance, comprise a test mass arranged to deform a capacitive element so as to change the element's capacitance and thus to produce an output voltage that may be indicative of an acceleration experienced by the test mass.

The second stage 8 may, for instance, comprise an amplifier for amplifying the prefiltered signal received from the first stage 6. The low pass filter in the sample-and-hold circuit (SH stage) 10 that may be provided by the resistive elements 48 and 50 may be arranged, for instance, to filter out noise that has either not been filtered out by the first stage or been introduced by the amplification stage 8. The SH circuit 10 described in reference to FIGS. 1 to 9 may, however, be used in electronic devices different from the one shown in FIG. 2.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the resistive elements 48 and 50 may be included in a filtering stage preceding the SH circuit 10.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the stages 4, 6, 8, 10, 11 may be within a single IC. Alternatively, the examples may be implemented as any number of separate integrated circuits or separate devices interconnected with each other in a suitable manner. For example, the stages 4, 6, 8, 10, 11 may be implemented as separate devices.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A sample-and-hold circuit comprising:
    an input;
    one or more dedicated capacitive elements;
    one or more parasitic capacitive elements connected to said one or more dedicated capacitive elements;
    an output;
    a group of switches; and
    a control unit, wherein
        said control unit is arranged to control said switches so as to interconnect said input, said one or more dedicated capacitive elements, and said output in a cyclic manner in accordance with a sample-and-hold cycle, and
        the sample-and-hold cycle comprises, in chronological order,
            an observation phase in which said one or more dedicated capacitive elements are disconnected from said output and connected to said input so as to adapt an electrical charge of said dedicated capacitive elements to an input voltage applied at said input,
            a read-out phase in which said one or more dedicated capacitive elements are disconnected from said input and connected to said output so as to provide an output voltage in dependence on said electrical charge,
            a sleep phase in which said one or more dedicated capacitive elements are disconnected from both said input and said output, said sleep phase involving a forward charge transfer between said one or more dedicated capacitive elements and said one or more parasitic capacitive elements, and
            a restoration phase in which said one or more dedicated capacitive elements are disconnected from said input and connected to said output so as to cause a reverse charge transfer between said one or more dedicated capacitive elements and said one or more parasitic capacitive elements, said reverse charge transfer canceling said forward charge transfer at least partly.

2. The sample-and-hold circuit of claim 1, wherein said control unit is arranged to set said switches into a read-out configuration in said read-out phase and into the same configuration in said restoration phase.

3. The sample-and-hold circuit of claim 1, wherein said restoration phase is shorter than said observation phase.

4. The sample-and-hold circuit of claim 1, wherein said cycle does not comprise any other phase after said restoration phase and before said observation phase.

5. The sample-and-hold circuit of claim 1, wherein said sleep phase is a second sleep phase and said cycle comprises a first sleep phase after said observation phase and before said read-out phase.

6. The sample-and-hold circuit of claim 1, comprising an operational amplifier arranged to output a reference voltage during said observation phase and to output said output voltage during said read-out phase.

7. The sample-and-hold circuit of claim 1, wherein said observation phase comprises, in chronological order:
  a first observation phase for sampling said input voltage; and
  a second observation phase for inverting said input voltage and sampling the inverted input voltage.

8. The sample-and-hold circuit of claim 7, wherein at least two of said dedicated capacitive elements are connected parallel after said observation phase and before said read-out phase so that charge balancing occurs to generate an output voltage-that corresponds to an average of said first input voltage and said inverted second input voltage.

9. The sample-and-hold circuit of claim 1, comprising one or more resistive elements which in said observation phase are connected between said input and said one or more dedicated capacitive elements to form a low-pass filter.

10. The sample-and-hold circuit of claim 9, wherein at least one of said one or more resistive elements has an adjustable resistance.

11. The sample-and-hold circuit of claim 1, implemented as or in an integrated circuit.

12. The sample-and-hold circuit of claim 11, comprising several layers stacked atop each other, said layers including at least a first layer and an adjoining second layer, said first layer comprising one or more metal shields, said second layer comprising said one or more dedicated capacitive elements at positions above or below one or more of said metal shields, said dedicated capacitive elements and said one or more metal shields together forming said parasitic capacitive elements.

13. A capacitive sensing device comprising a capacitive sensor and a sample-and-hold circuit as set forth in claim 1, wherein said capacitive sensor is connected or connectable to said input of said sample-and-hold circuit.

\* \* \* \* \*